United States Patent
Nakaki et al.

(10) Patent No.: US 12,417,962 B2
(45) Date of Patent: Sep. 16, 2025

(54) SEMICONDUCTOR STORAGE DEVICE

(71) Applicant: KIOXIA CORPORATION, Tokyo (JP)

(72) Inventors: Hiroshi Nakaki, Yokkaichi Mie (JP); Megumi Ishiduki, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 493 days.

(21) Appl. No.: 17/901,812

(22) Filed: Sep. 1, 2022

(65) Prior Publication Data

US 2023/0307323 A1 Sep. 28, 2023

(30) Foreign Application Priority Data

Mar. 22, 2022 (JP) .................... 2022-044896

(51) Int. Cl.
| | |
|---|---|
| *H01L 23/48* | (2006.01) |
| *G11C 16/04* | (2006.01) |
| *H10B 41/10* | (2023.01) |
| *H10B 41/27* | (2023.01) |
| *H10B 41/35* | (2023.01) |
| *H10B 43/10* | (2023.01) |

(Continued)

(52) U.S. Cl.
CPC ........ *H01L 23/481* (2013.01); *G11C 16/0483* (2013.01); *H10B 41/10* (2023.02); *H10B 41/27* (2023.02); *H10B 41/35* (2023.02); *H10B 43/10* (2023.02); *H10B 43/27* (2023.02); *H10B 43/35* (2023.02)

(58) Field of Classification Search
CPC ........ H10B 41/27; H10B 43/27; H10B 41/35; H10B 43/35; H10B 43/10; H10B 41/10
See application file for complete search history.

(56) References Cited

U.S. PATENT DOCUMENTS

| | | | |
|---|---|---|---|
| 11,114,162 B2 | 9/2021 | Hosomura | |
| 11,250,912 B2 * | 2/2022 | Ogawa | G11C 16/10 |

(Continued)

FOREIGN PATENT DOCUMENTS

| | | |
|---|---|---|
| JP | 2020-107673 A | 7/2020 |
| JP | 2020-150073 A | 9/2020 |

(Continued)

*Primary Examiner* — Jaehwan Oh
(74) *Attorney, Agent, or Firm* — Kim & Stewart LLP

(57) ABSTRACT

A semiconductor storage device includes a stacked body in which conductive and insulating layers are alternately stacked in a first direction, conductive lines extending along a second direction intersecting the first direction and arranged along a third direction intersecting the first and second directions, insulators extending along the first and third directions in the body, arranged along the second direction, and dividing conductive layers, columnar bodies extending along the first direction and arranged along the second direction between insulators, each columnar body including a semiconductor body forming memory cells, and vias each connected between a conductive line and a corresponding columnar body. The conductive lines include first through fourth lines, and the columnar bodies include first through fourth bodies, arranged in this order. When viewed from the first direction, the first through fourth columnar bodies respectively overlap and are electrically connected to the first, third, second, and fourth lines.

20 Claims, 7 Drawing Sheets

(51) Int. Cl.
*H10B 43/27* (2023.01)
*H10B 43/35* (2023.01)

(56) References Cited

U.S. PATENT DOCUMENTS

| | | | |
|---|---|---|---|
| 2014/0284674 A1* | 9/2014 | Iwai | H10B 43/35 |
| | | | 257/298 |
| 2017/0263628 A1* | 9/2017 | Nakaki | H10B 43/10 |
| 2020/0212059 A1 | 7/2020 | Nishikawa | |
| 2020/0295016 A1 | 9/2020 | Harada et al. | |
| 2021/0043640 A1* | 2/2021 | Kawaguchi | G11C 16/0483 |
| 2021/0066340 A1* | 3/2021 | Kanno | H10B 41/27 |
| 2021/0091044 A1 | 3/2021 | Yamashita et al. | |
| 2021/0265387 A1* | 8/2021 | Oike | H10B 41/10 |
| 2021/0313335 A1 | 10/2021 | Hirayama | |
| 2023/0106571 A1* | 4/2023 | Shen | G11C 8/14 |
| | | | 257/314 |

FOREIGN PATENT DOCUMENTS

| | | |
|---|---|---|
| JP | 2021-034529 A | 3/2021 |
| JP | 2021-048353 A | 3/2021 |
| TW | 202114070 A | 4/2021 |
| TW | I724338 B | 4/2021 |

\* cited by examiner

SEMICONDUCTOR STORAGE DEVICE

CROSS-REFERENCE TO RELATED APPLICATION(S)

This application is based upon and claims the benefit of priority from Japanese Patent Application No. 2022-044896, filed Mar. 22, 2022, the entire contents of which are incorporated herein by reference.

FIELD

Embodiments described herein relate generally to a semiconductor storage device and a storage system.

BACKGROUND

A NAND flash memory in which memory cells are three-dimensionally stacked is known.

DETAILED DESCRIPTION

Figure 1:
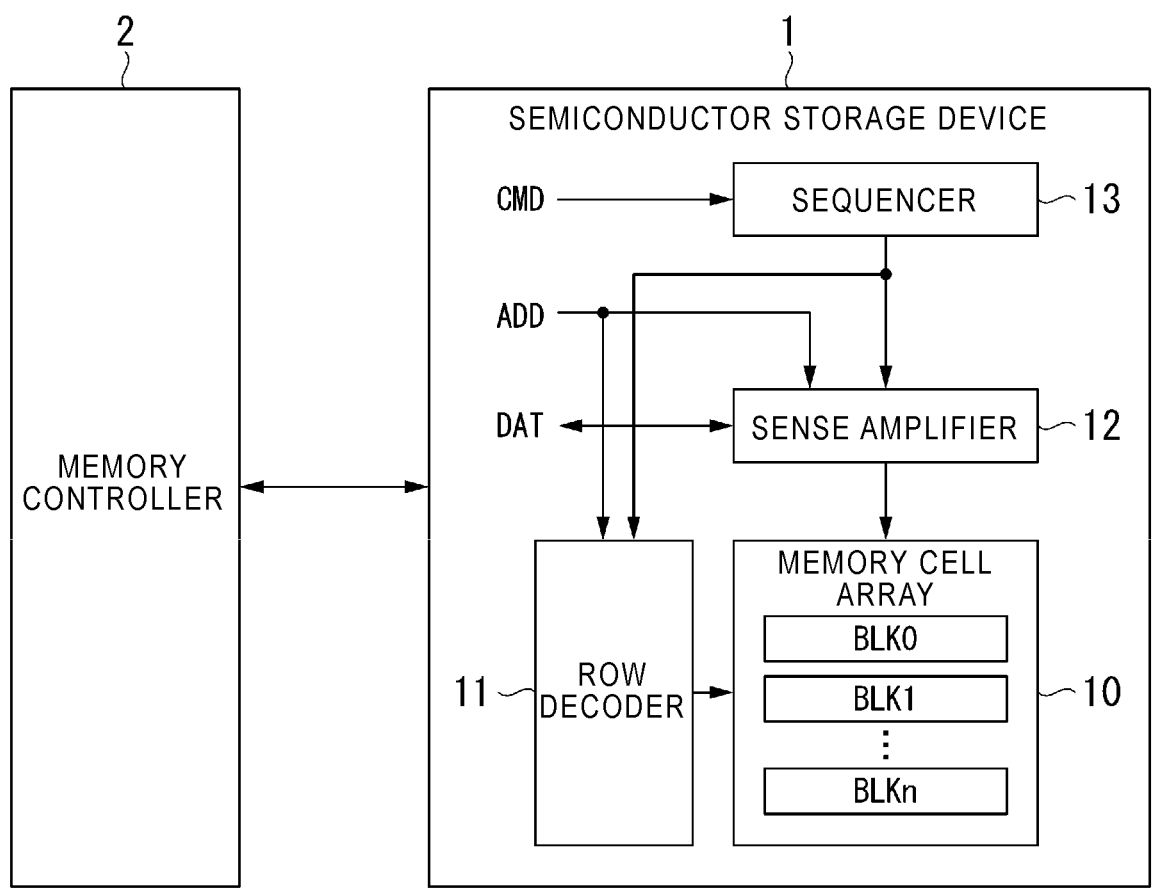
FIG. 1 is a block diagram showing a semiconductor storage device a memory controller according to a first embodiment.

Embodiments provide a semiconductor storage device with high integration.

In general, according to one embodiment, a semiconductor storage device includes a stacked body in which a plurality of conductive layers and a plurality of insulating layers are alternately stacked in a first direction, a plurality of conductive lines extending along a second direction intersecting the first direction and arranged along a third direction intersecting the first and second directions, a plurality of insulators extending along the first and third directions in the stacked body, arranged along the second direction, and dividing one or more of the conductive layers in the second direction, a plurality of columnar bodies extending along the first direction and arranged along the second direction between two of the insulators, each of the columnar bodies including a semiconductor body by which a plurality of memory cells are formed, and a plurality of vias each electrically connected between one of the conductive lines and a corresponding one of the columnar bodies. The conductive lines include first, second, third, and fourth lines arranged in this order. The columnar bodies include first, second, third, and fourth columnar bodies arranged in this order. When viewed from the first direction, the first, second, third, and fourth columnar bodies respectively overlap and are electrically connected to the first, third, second, and fourth lines via the corresponding vias.

Hereinafter, a semiconductor storage device according to certain example embodiments will be described with reference to the drawings. In the following description, elements having substantially the same or similar functions are denoted by the same reference numerals. Redundant descriptions of repeated elements may be omitted. Suffixes (numerical or alphabetical) may be appended to certain reference symbols to distinguish between different instances of the same basic element or component of the same or substantially similar design. When it is unnecessary to distinguish between different instances, or when the description applies to each instance, the suffix(es) may be omitted and just the base reference symbol used to refer to all instances as the case may be.

The drawings are schematic or conceptual, and depicted dimensions, dimensional ratios between different components, and the like are not necessarily the same as actual ones.

In the present application, a term "connect" means not only "physically connect" but "electrically connect". In the present application, terms "parallel", "orthogonal", and "identical" may mean "substantially parallel", "substantially orthogonal", and "substantially identical", respectively. In the present application, an expression "(an element) extending in A direction" means that the dimension of the element in A direction is larger than the dimensions in the other directions, e.g., Y direction and Z direction.

In this disclosure, the X direction and the Y direction are directions substantially parallel to a surface of a substrate Sub. The X direction and the Y direction are orthogonal to each other. The Z direction is orthogonal to the X direction and the Y direction and is a direction going away from the substrate Sub. It is noted that these expressions are only for convenience of description and do not define a gravitational direction.

In the drawings, the Y direction corresponds to an extending direction of bit lines BL, and the Z direction corresponds to a vertical direction from the surface of the substrate Sub used to form a semiconductor storage device 1. In a plan view, hatching is appropriately added to a part of a configuration for easy viewing of the drawings. The hatching added to the plan view is not necessarily related to a material or characteristics of an element to which the hatching is added. In each of the plan view and the cross-sectional view, illustration of some elements such as wires, contacts, and interlayer insulating films is omitted as appropriate for easy viewing of the drawings.

<1> First Embodiment

The semiconductor storage device 1 according to a first embodiment will be described below.

<1-1> Overall Configuration of Semiconductor Storage Device 1

FIG. 1 is a block diagram showing the semiconductor storage device 1 and a memory controller 2. The semiconductor storage device 1 is a non-volatile semiconductor storage device, and is, for example, a NAND flash memory. The semiconductor storage device 1 and the memory controller 2 can make up a storage system in one embodiment. The semiconductor storage device 1 includes, for example, a memory cell array 10, a row decoder 11, a sense amplifier 12, and a sequencer 13.

The memory cell array 10 includes a plurality of blocks BLK0 to BLKn (n is an integer of 1 or more). Each block BLK is a set of non-volatile memory cell transistors MT (see FIG. 2). The memory cell array 10 includes a plurality of conductive bit lines and word lines. Each memory cell transistor MT is connected to one bit line and one word line. A detailed configuration of the memory cell array 10 will be described later.

The row decoder 11 selects one block BLK based on address information ADD received from the external memory controller 2. The row decoder 11 controls a write operation and a read operation of data with respect to the memory cell array 10 by applying a desired voltage to each of the plurality of word lines.

The sense amplifier 12 applies a desired voltage to each bit line according to write data DAT received from the memory controller 2. The sense amplifier 12 determines data stored in each memory cell transistor MT based on the voltage of the bit line and transmits the determined read data DAT to the memory controller 2.

The sequencer 13 is a control circuit that controls an overall operation of the semiconductor storage device 1 based on a command CMD received from the memory controller 2.

The semiconductor storage device 1 and the memory controller 2 described above may be integrated into one semiconductor device. Examples of the semiconductor device include a memory card such as an SD (registered trademark) card, and a solid-state drive (SSD).

<1-2> Circuit Configuration of Memory Cell Array 10

Next, an electrical configuration of the memory cell array 10 will be described.

Figure 2:
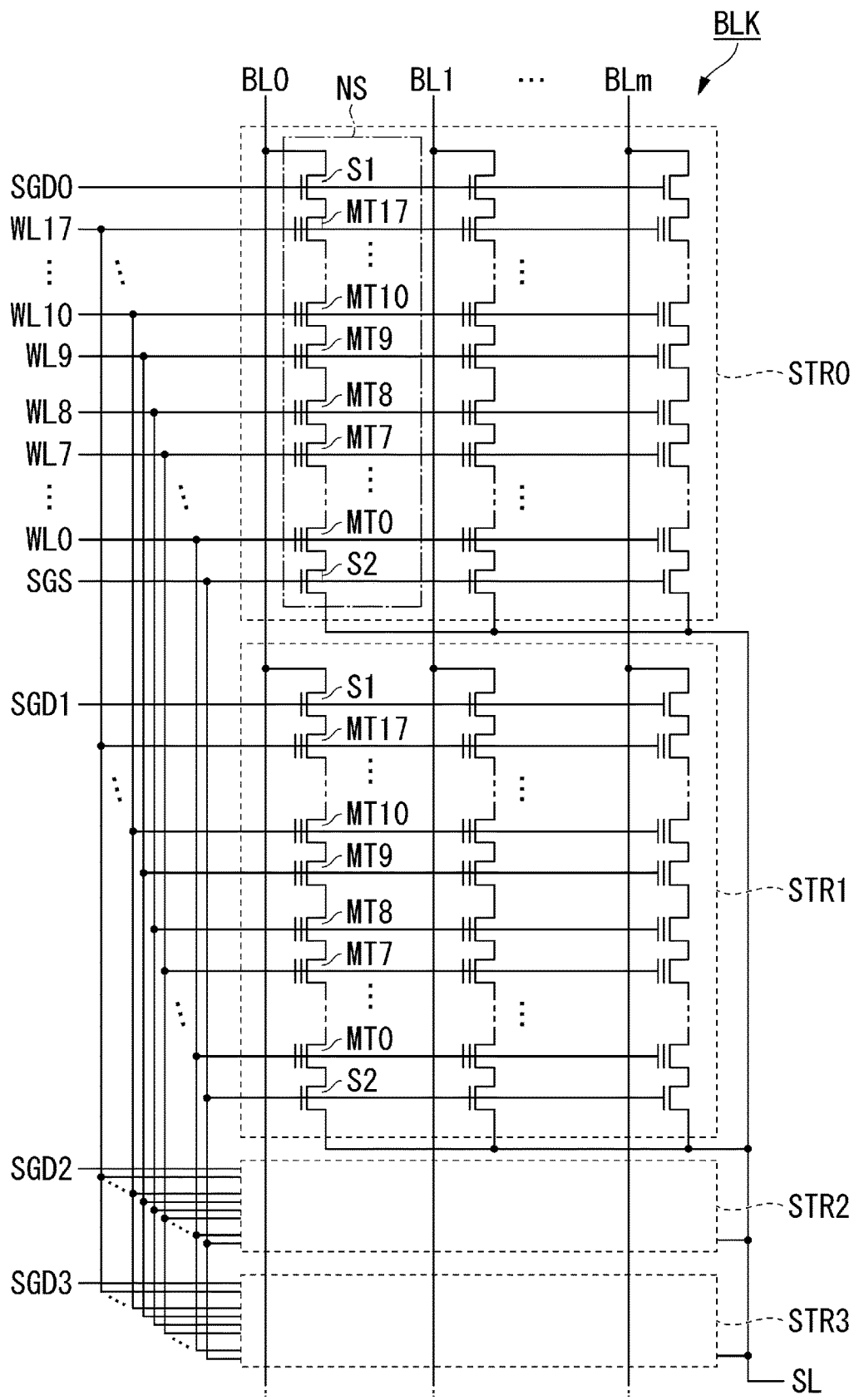
FIG. 2 depicts an equivalent circuit of a memory cell array of a semiconductor storage device according to a first embodiment.

FIG. 2 depicts an equivalent circuit of a part of the memory cell array 10. FIG. 2 shows one block BLK in the memory cell array 10. The block BLK includes a plurality of (for example, four) strings STR0 to STR3.

Each of the strings STR0 to STR3 is an aggregate of a plurality of NAND strings NS. One end of each NAND string NS is connected to any of bit lines BL0 to BLm (m is an integer of 1 or more). The other end of the NAND string NS is connected to a source line SL. Each NAND string NS includes a plurality of memory cell transistors MT0 to MTn (n is an integer of 1 or more), a first select transistor S1, and a second select transistor S2.

The memory cell transistors MT0 to MTn are electrically connected to each other in series. Each memory cell transistor MT includes a control gate and a memory stacked film (for example, a charge storage film), and stores data in a non-volatile manner. The memory cell transistor MT changes a state of the memory stacked film (for example, stores charges in the charge storage film) according to a voltage applied to the control gate. The control gate of the memory cell transistor MT is connected to one of the corresponding word lines WL0 to WLn. Each memory cell transistor MT is electrically connected to the row decoder 11 via the word line WL.

The first select transistor S1 in each NAND string NS is connected between the plurality of memory cell transistors MT0 to MTn and any of the bit lines BL0 to BLm. A drain of the first select transistor S1 is connected to any of the bit lines BL0 to BLm. A source of the first select transistor S1 is connected to the memory cell transistor MTn. A control gate of the first select transistor S1 in each NAND string NS is connected to any of select gate lines SGD0 to SGD3. The first select transistor S1 is electrically connected to the row decoder 11 via the select gate line SGD. When a predetermined voltage is applied to any of the select gate lines SGD0 to SGD3, the first select transistor S1 connects the NAND string NS and the bit line BL.

The second select transistor S2 in each NAND string NS is connected between the plurality of memory cell transistors MT0 to MTn and the source line SL. A drain of the second select transistor S2 is connected to the memory cell transistor MT0. A source of the second select transistor S2 is connected to the source line SL. A control gate of the second select transistor S2 is connected to a select gate line SGS. The second select transistor S2 is electrically connected to the row decoder 11 via the select gate line SGS. When a predetermined voltage is applied to the select gate line SGS, the second select transistor S2 connects the NAND string NS and the source line SL.

The memory cell array 10 may have a circuit configuration other than that described above. For example, the number of strings STR in each block BLK, the number of memory cell transistors MT in each NAND string NS, and the number of select transistors S1 and S2 may be changed. The NAND string NS may include one or more dummy transistors.

<1-3> Structure of Memory Cell Array 10

An example of a structure of the memory cell array 10 according to the present embodiment will be described below.

In the drawings referred to below, hatching is appropriately added to a plan view for easy viewing of the drawings. The hatching added to the plan view is not necessarily related to a material or characteristics of an element to which the hatching is added. In a cross-sectional view, elements such as an insulating layer (e.g., an interlayer insulating film), a wire, and a contact are omitted as appropriate for easier viewing of other aspects in the drawings.

<1-3-1> Planar Layout of Memory Cell Array 10

An example of a planar layout of the memory cell array 10 in the semiconductor storage device 1 according to the first embodiment will be described with reference to FIG. 3A.

Figure 3A:
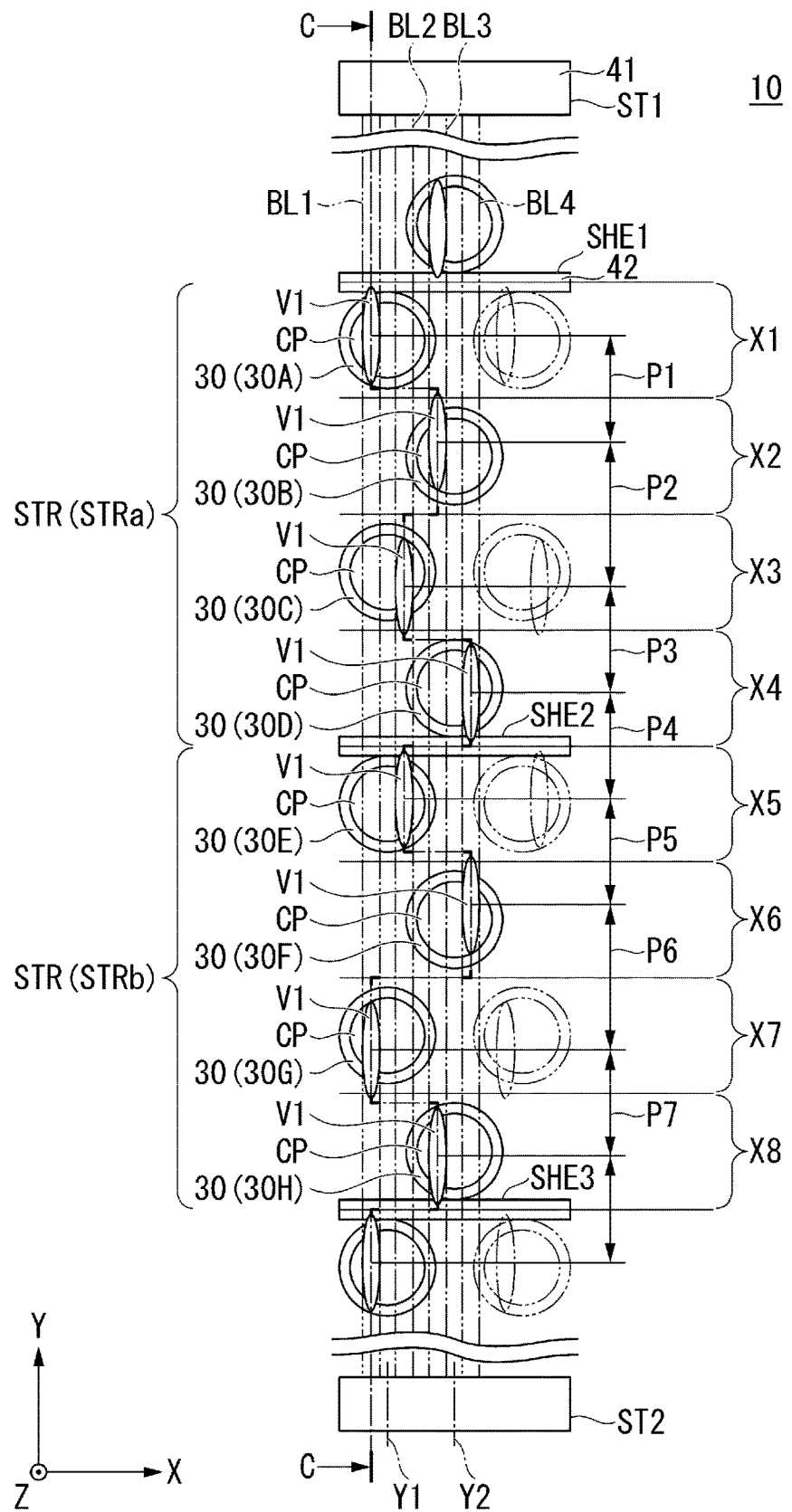
FIG. 3A is a plan view showing a semiconductor storage device according to a first embodiment.

FIG. 3A is a plan view showing a part of the semiconductor storage device 1 according to the first embodiment. Specifically, FIG. 3A is a plan view of a characteristic part of a cell array region of the memory cell array 10. FIG. 3A is a plan view of a stacked body 20 (see FIG. 4), and bit lines BL1 to BL4 located above the stacked body 20 in Z direction are indicated by dotted lines. In FIG. 3A, only a region corresponding to one block BLK is shown.

As shown in FIG. 3A, the memory cell array 10 includes a plurality of slits ST (ST1 and ST2 in FIG. 3A) and a plurality of slits SHE (SHE1 to SHE3 in FIG. 3A). Each of the slits ST is a groove that penetrates the stacked body 20 in the Z direction and divides the stacked body 20 in the Y direction. That is, each slit ST extends along the Z direction and the X direction, and a plurality of conductive layers 21 that are stacked in Z direction are divided in Y direction by the slit ST. Each of the slits SHE extends from an upper surface 20a of the stacked body 20 on a bit line side to a middle of the stacked body 20. All the slits ST and SHE extend along X direction.

The slits ST extend along the X direction and are arranged in the Y direction. The plurality of slits SHE is laid out between adjacent slits ST in the Y direction. The slits SHE extend along the X direction and are arranged in the Y direction.

Specifically, the slit ST divides the conductive layers 21 corresponding to, for example, a gate electrode, the select gate lines SGD, and the select gate line SGS. In other words, the slit ST extends in the X direction, and separates, in the Y direction, the conductive layers 21 corresponding to the gate electrode, the select gate lines SGD, and the select gate line SGS.

Meanwhile, the slit SHE is provided from the upper surface 20a of the stacked body 20 to the middle of the stacked body 20. That is, the slit SHE extends in the Z direction and the X direction, and a part including at least an uppermost layer (that is, the conductive layer 21 closest to the bit line BL) among the conductive layers 21 is divided in Y direction by the slit SHE. Specifically, the slit SHE is provided up to a position corresponding to the conductive layer 21 (a conductive layer 21C) corresponding to one of the select gate lines SGD. That is, the slit SHE extends in the X direction and separates, in the Y direction, the conductive layers 21 (conductive layers 21C) corresponding to the select gate lines SGD.

The slit ST has a structure in which a first insulator 41 made of an insulating member is embedded in the groove. The slit SHE has a structure in which a second insulator 42 made of an insulating member is embedded in the groove. A conductor may be embedded in the slit ST via the first insulator 41. The embedded conductor may be used as a contact of the source line SL.

In the planar layout of the memory cell array 10 described above, each of regions defined by the slits ST and the slits SHE corresponds to one string STR. For example, in the example shown in FIG. 3A, strings STRa and STRb extend in the X direction and are bounded (defined) by the slits SHE1 to SHE3 along the Y direction. That is, the strings STRa and STRb are adjacent to each other in the Y direction with the slit SHE2 interposed therebetween. Further, in the memory cell array 10, for example, the layout shown in FIG. 3A is repeatedly disposed in Y direction.

<1-3-2> Structure of Memory Cell Array 10 in Cell Region

Next, a planar layout of the memory cell array 10 in a cell region of the semiconductor storage device 1 according to the first embodiment will be described. The number of columnar bodies 30, the number of contacts CP, the number of vias V1, and the number of bit lines BL described below are examples, and the present embodiment is not limited thereto. That is, the number of contacts CP, the number of vias V1, and the number of bit lines BL in the present embodiment may be changed in various ways without departing from the gist of the present embodiment.

As shown in FIG. 3A, the memory cell array 10 includes a plurality of columnar bodies 30, a plurality of contacts CP, a plurality of vias V1, and a plurality of bit lines BL. Specifically, the memory cell array 10 includes, for each string STR, four columnar bodies 30 disposed at different positions in the Y direction, four contacts CP, four vias V1 corresponding to the columnar bodies 30, and four bit lines BL (BL1 to BL4).

Each of the columnar bodies 30 functions as, for example, one NAND string NS.

The columnar bodies 30 are provided along a plurality of "columns" and "rows".

Each "column" in which a plurality of columnar bodies 30 are arranged extends in Y direction, and two columns are provided between the bit lines BL1 and BL2 and between the bit lines BL3 and BL4. Specifically, a first column Y1 is provided between the bit lines BL1 and BL2, and a second column Y2 is provided between the bit lines BL3 and BL4. Although partially omitted in FIG. 3A, in the memory cell array 10, a group of four columnar bodies 30, four contacts CP, four vias V1 corresponding to the columnar bodies 30, and four bit lines BL (BL1 to BL4), may also be repeatedly disposed, for example, in the X direction. In such a case, the first column Y1 and the second column Y2 shown in FIG. 3A are alternately provided in the X direction.

The "row" in which a plurality of columnar bodies 30 are arranged extends in the X direction, and a plurality of rows are provided in the Y direction between the slits ST. Specifically, in the example shown in FIG. 3A, four rows are provided in each string STR. Here, four rows in the string STRa are sequentially labeled with X1, X2, X3, and X4 from the row close to the slit ST1 in the Y direction, and four rows in the string STRb are sequentially labeled with X5, X6, X7, and X8 from the row close to the slit ST1 in the Y direction. In addition, a row Xm (m is 1 to 8) may be referred to as an "m-th row" (for example, a "first row" in a case of the row X1).

In the memory cell array 10 of the present embodiment, columnar bodies 30 in each row are provided corresponding to either the first column Y1 or the second column Y2.

Each of the columnar bodies 30 extends in the Z direction and penetrate the stacked body 20 in the Z direction, for example. For example, the columnar bodies 30 are arranged in a zigzag manner in the Y direction in a plan view from the Z direction. The number of the columnar bodies 30 arranged in a zigzag manner in the Y direction in each string STR is, for example, the same. In each string STR shown in FIG. 3A, four columnar bodies 30 are arranged in a zigzag manner in the Y direction. Each columnar body 30 is, for example, a circle or an ellipse in a plan view from the Z direction.

Here, in the string STRa, the columnar bodies 30 arranged in a zigzag manner in the Y direction are referred to as a first columnar body 30A, a second columnar body 30B, a third columnar body 30C, and a fourth columnar body 30D. In the string STRb, the columnar bodies 30 arranged in a zigzag manner in the Y direction are referred to as a fifth columnar body 30E, a sixth columnar body 30F, a seventh columnar body 30G, and an eighth columnar body 30H.

In the string STRa, the first columnar body 30A, the second columnar body 30B, the third columnar body 30C, and the fourth columnar body 30D are sequentially arranged in the Y direction. In the string STRb, the fifth columnar body 30E, the sixth columnar body 30F, the seventh columnar body 30G, and the eighth columnar body 30H are sequentially arranged in the Y direction.

Specifically, as shown in FIG. 3A, in the string STRa, the first columnar body 30A is provided in the first row of the first column Y1, the second columnar body 30B is provided in the second row of the second column Y2, the third columnar body 30C is provided in the third row of the first column Y1, and the fourth columnar body 30D is provided in the fourth row of the second column Y2. That is, the first columnar body 30A and the third columnar body 30C overlap both the first bit line BL1 and the second bit line BL2 when viewed from the Z direction, and the second columnar body 30B and the fourth columnar body 30D overlap both the third bit line BL3 and the fourth bit line BL4 when viewed from the Z direction. In addition, the second columnar body 30B is disposed between the first columnar body 30A and the third columnar body 30C in the Y direction, and the fourth columnar body 30D is disposed at an opposite side from the second columnar body 30B with respect to the third columnar body 30C in the Y direction.

Meanwhile, in the string STRb, the fifth columnar body 30E is provided in the fifth row of the first column Y1, the sixth columnar body 30F is provided in the sixth row of the second column Y2, the seventh columnar body 30G is provided in the seventh row of the first column Y1, and the eighth columnar body 30H is provided in the eighth row of the second column Y2. That is, the fifth columnar body 30E and the seventh columnar body 30G overlap both the first bit line BL1 and the second bit line BL2 when viewed from the Z direction, and the sixth columnar body 30F and the eighth columnar body 30H overlap both the third bit line BL3 and the fourth bit line BL4 when viewed from the Z direction. In addition, the sixth columnar body 30F is disposed between the fifth columnar body 30E and the seventh columnar body 30G in the Y direction, and the eighth columnar body 30H is disposed at an opposite side from the sixth columnar body 30F with respect to the seventh columnar body 30G in the Y direction.

The bit lines BL extend in the Y direction and are arranged in the X direction. Each bit line BL is laid out to overlap two columnar bodies 30 for each string STR. The bit lines BL that are electrically connected to any of the first columnar body 30A, the second columnar body 30B, the third columnar body 30C, the fourth columnar body 30D, the fifth columnar body 30E, the sixth columnar body 30F, the seventh columnar body 30G, and the eighth columnar body 30H are referred to as the first bit line BL1, the second bit line BL2, the third bit line BL3, and the fourth bit line BL4, respectively. The first bit line BL1, the second bit line BL2, the third bit line BL3, and the fourth bit line BL4 are sequentially arranged in the X direction.

In the present example shown in FIG. 3A, in each columnar body 30, two bit lines BL are laid out to overlap the columnar body. For example, the first columnar body 30A overlaps two bit lines including the first bit line BL1 and the second bit line BL2 when viewed from the Z direction. The via V1 is provided between one of the two bit lines BL overlapping the columnar body 30 and the columnar body 30. Each columnar body 30 is electrically connected to the corresponding bit line BL through the via V1. Specifically, the columnar body 30 is connected to the bit line BL through the via V1 provided below the bit line BL and the contact CP provided below the via V1.

Here, in the string STRa, the first columnar body 30A is electrically connected to the first bit line BL1, the second columnar body 30B is electrically connected to the third bit line BL3, the third columnar body 30C is electrically connected to the second bit line BL2, and the fourth columnar body 30D is electrically connected to the fourth bit line BL4.

In the string STRb adjacent to the string STRa (with the slit SHE2 interposed therebetween in the Y direction), the fifth columnar body 30E is electrically connected to the second bit line BL2, the sixth columnar body 30F is electrically connected to the fourth bit line BL4, the seventh columnar body 30G is electrically connected to the first bit line BL1, and the eighth columnar body 30H is electrically connected to the third bit line BL3.

Figure 3B:
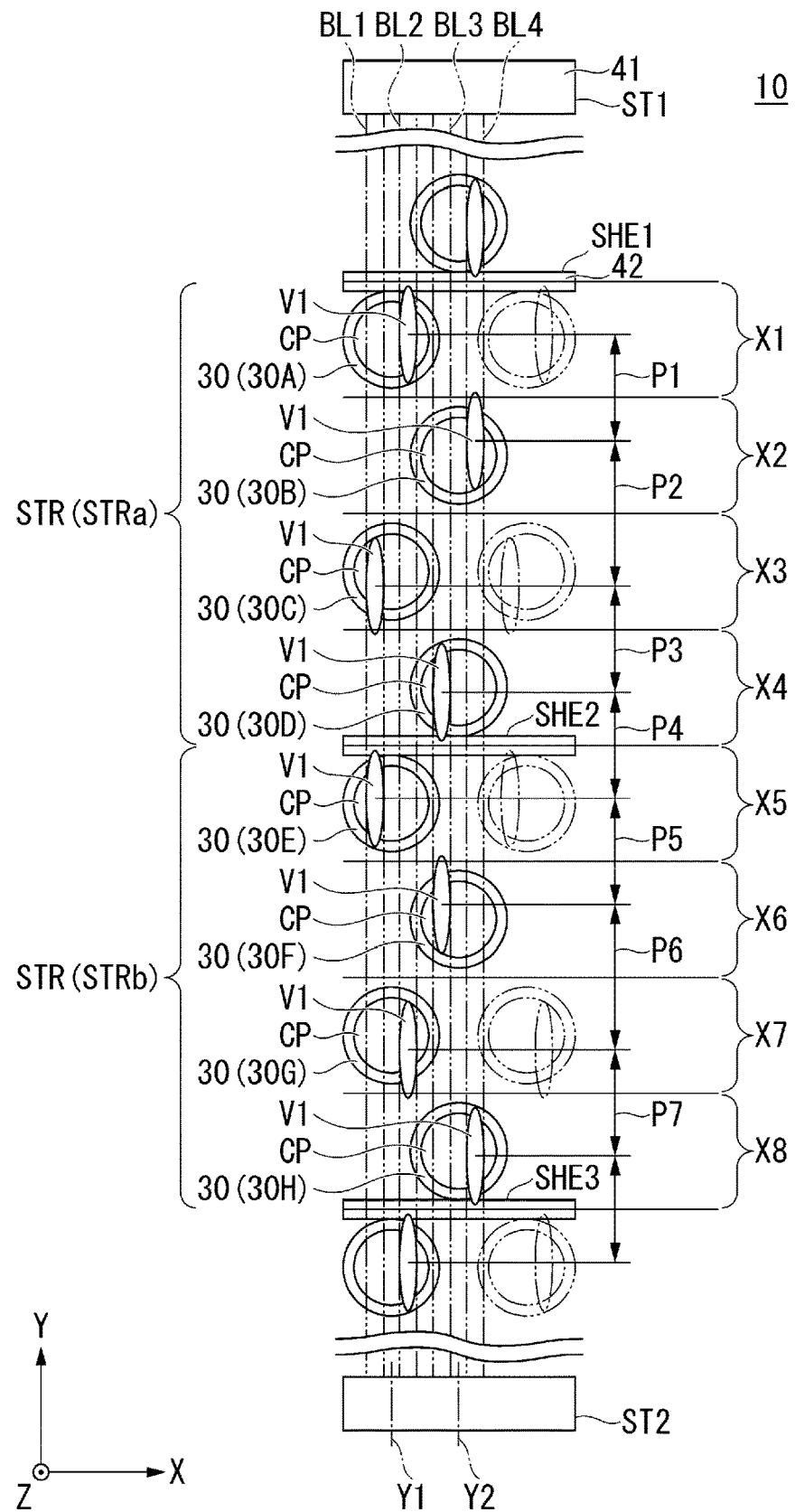
FIG. 3B is a plan view showing a semiconductor storage device according to a modification of a first embodiment.

As a modification of the first embodiment, the string STRa may be, as shown in FIG. 3B, laid out such that the first columnar body 30A is electrically connected to the second bit line BL2, the second columnar body 30B is electrically connected to the fourth bit line BL4, the third columnar body 30C is electrically connected to the first bit line BL1, and the fourth columnar body 30D is electrically connected to the third bit line BL3. In such a case, in the string STRb, the fifth columnar body 30E is electrically connected to the first bit line BL1, the sixth columnar body 30F is electrically connected to the third bit line BL3, the seventh columnar body 30G is electrically connected to the second bit line BL2, and the eighth columnar body 30H is electrically connected to the fourth bit line BL4.

In the present embodiment, the intervals in the Y direction between the vias V1 corresponding to the first columnar body 30A to the eighth columnar body 30H are referred to as pitches P1, P2, P3, P4, P5, P6, and P7, respectively. It is desirable that the pitch P2 and the pitch P6 are larger than the pitches P1, P3, P4, P5, and P7. That is, the pitch P2 in the Y direction between the vias V1 connected to the second columnar body 30B and the third columnar body 30C respectively, and the pitch P6 in the Y direction between the vias V1 connected to the sixth columnar body 30F and the seventh columnar body 30G respectively, are preferably larger than the pitches between the vias V1 corresponding to other columnar bodies 30. When one contact CP is formed on each of the columnar bodies 30, a part in which the interval between the vias V1 is small is likely to be generated. Therefore, by increasing the pitch in the Y direction between the vias V1 in the part in which the interval between the vias V1 is small, it is possible to reduce a possibility that the vias V1 come into contact or short-circuit with each other due to a manufacturing error when the vias V1 are manufactured by photolithography, and improve integration of the columnar bodies 30 in one block BLK.

In the present embodiment, it is desirable that the pitch P1 between the vias V1 connected to the first columnar body 30A and the second columnar body 30B, the pitch P3 between the vias V1 connected to the third columnar body 30C and the fourth columnar body 30D, the pitch P4 between the vias V1 connected to the fourth columnar body 30D and the fifth columnar body 30E, the pitch P5 between the vias V1 connected to the fifth columnar body 30E and the sixth columnar body 30F, and the pitch P7 between the vias V1 connected to the seventh columnar body 30G and the eighth columnar body 30H are all the same. Thus, it is possible to further improve the integration of the columnar bodies 30 in one block BLK.

In addition, regarding arrangement of the columnar bodies 30, pitches between adjacent columnar bodies 30 in the X direction may not be the same. It is noted that, from a viewpoint of integration of the columnar bodies 30, it is desirable that the columnar bodies 30 are disposed at substantially equal pitches in a plan view from the Z direction. Similarly, pitches between adjacent columnar bodies 30 in the Y direction may not be the same, but it is desirable that the columnar bodies 30 are disposed at substantially equal pitches in the Y direction. Specifically, it is desirable that the columnar bodies 30 are arranged at the same pitch in the Y direction and are also arranged at the same pitch in the X direction. Thus, it is possible to further improve the integration of the columnar bodies 30 in one block BLK.

The detailed planar layout of the memory cell array 10 in the cell region of the semiconductor storage device 1 according to the present embodiment is described above, but the semiconductor storage device 1 according to the present embodiment is not limited to the layout shown in FIG. 3A. The semiconductor storage device 1 may have, for example, a layout in which the string STRa and the string STRb are alternately and repeatedly disposed along the Y direction between the adjacent slits ST.

In the planar layout of the memory cell array 10 described above, the number of slits SHE laid out between the adjacent slits ST may be designed to be any number. The number of strings STR laid out between two adjacent slits ST changes based on the number of slits SHE laid out between the two adjacent slits ST.

<1-3-3> Cross-Sectional Structure in Cell Region of Memory Cell Array 10

Next, an example of a cross-sectional structure in a cell region of the memory cell array 10 in the semiconductor storage device 1 according to the first embodiment will be described with reference to FIG. 4.

Figure 4:
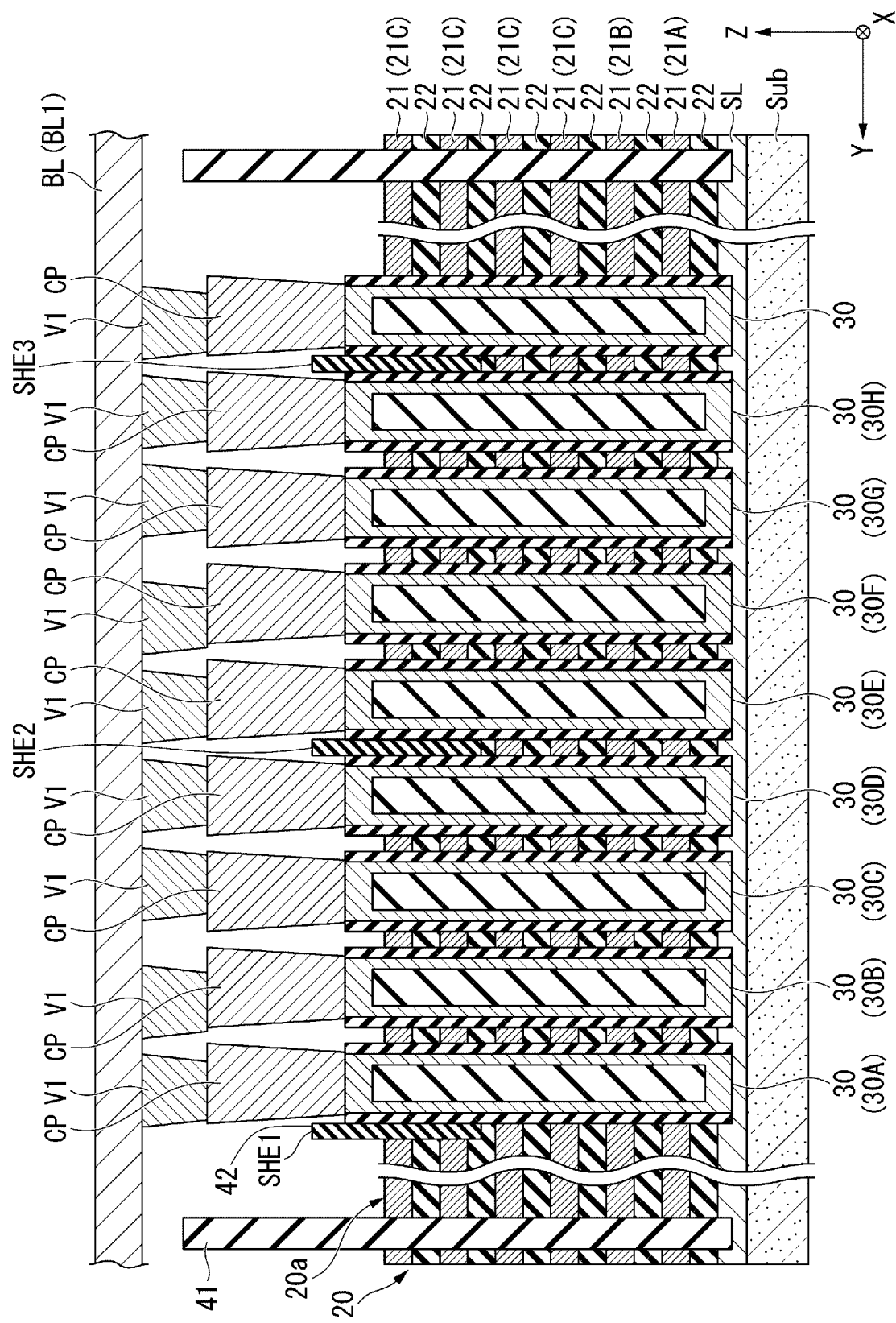
FIG. 4 is a cross-sectional view showing a semiconductor storage device according to a first embodiment.

FIG. 4 is a cross-sectional view taken along a line C-C in FIG. 3A. As described above, the memory cell array 10 includes the substrate Sub, the source line SL, the stacked body 20, the columnar bodies 30, the contacts CP, the vias V1, and the bit lines BL.

The substrate Sub is, for example, a silicon substrate. For example, the cell array region and a peripheral region of the memory cell array 10 are formed on the substrate Sub.

The source line SL is disposed on the substrate Sub. The source line SL is made of a conductor material or a semiconductor material. The source line SL is, for example, a p-type semiconductor. The source line SL extends in the X direction and the Y direction.

The stacked body 20 includes the conductive layers 21 and a plurality of insulating layers 22 in the Z direction. The conductive layer 21 and the insulating layer 22 are alternately stacked. Each of the conductive layers 21 extends in the X direction and the Y direction. Each of the insulating layers 22 extends in the X direction and the Y direction. The conductive layer 21 is made of, for example, a metal or semiconductor material. The conductive layer 21 is made of, for example, tungsten or polysilicon doped with impurities. The total number of the conductive layers 21 can be any number.

The conductive layers 21 are functionally divided into, for example, three parts.

A conductive layer 21A is closest to the source line SL among the conductive layers 21. A plurality of conductive layers 21A may be provided. The conductive layer 21A functions as, for example, the select gate line SGS connected to the second select transistor S2.

A conductive layer 21B is second close to the source line SL after the conductive layer 21A among the conductive layers 21. The conductive layer 21B is connected to the word line WL. The conductive layers 21B function as a gate electrode of the memory cell transistor MT. A plurality of conductive layers 21B may be provided and connected to a plurality of word lines WL.

Conductive layers 21C are those among the conductive layers 21 excluding the conductive layers 21A and 21B. The conductive layers 21C are, for example, several upper conductive layers in the stacked body 20. The conductive layers 21C function as, for example, the select gate lines SGD connected to the first select transistor S1.

The insulating layers 22 are between the source line SL and the lowermost conductive layer 21C and between adjacent conductive layers 21 in Z direction. The insulating layer 22 includes, for example, silicon oxide. The insulating layer 22 insulates adjacent conductive layers 21 from each other. The number of insulating layers 22 is determined by the number of conductive layers 21.

The bit line BL is provided above the uppermost conductive layer 21 (conductive layer 21C) with the contact CP and the via V1 interposed therebetween. The bit line BL is formed on a line extending along the Y direction. The bit line BL includes, for example, copper (Cu).

The columnar bodies 30 extend along Z direction and penetrate the stacked body 20, and bottom portions of the columnar bodies 30 are in contact with the source line SL.

Figure 5:
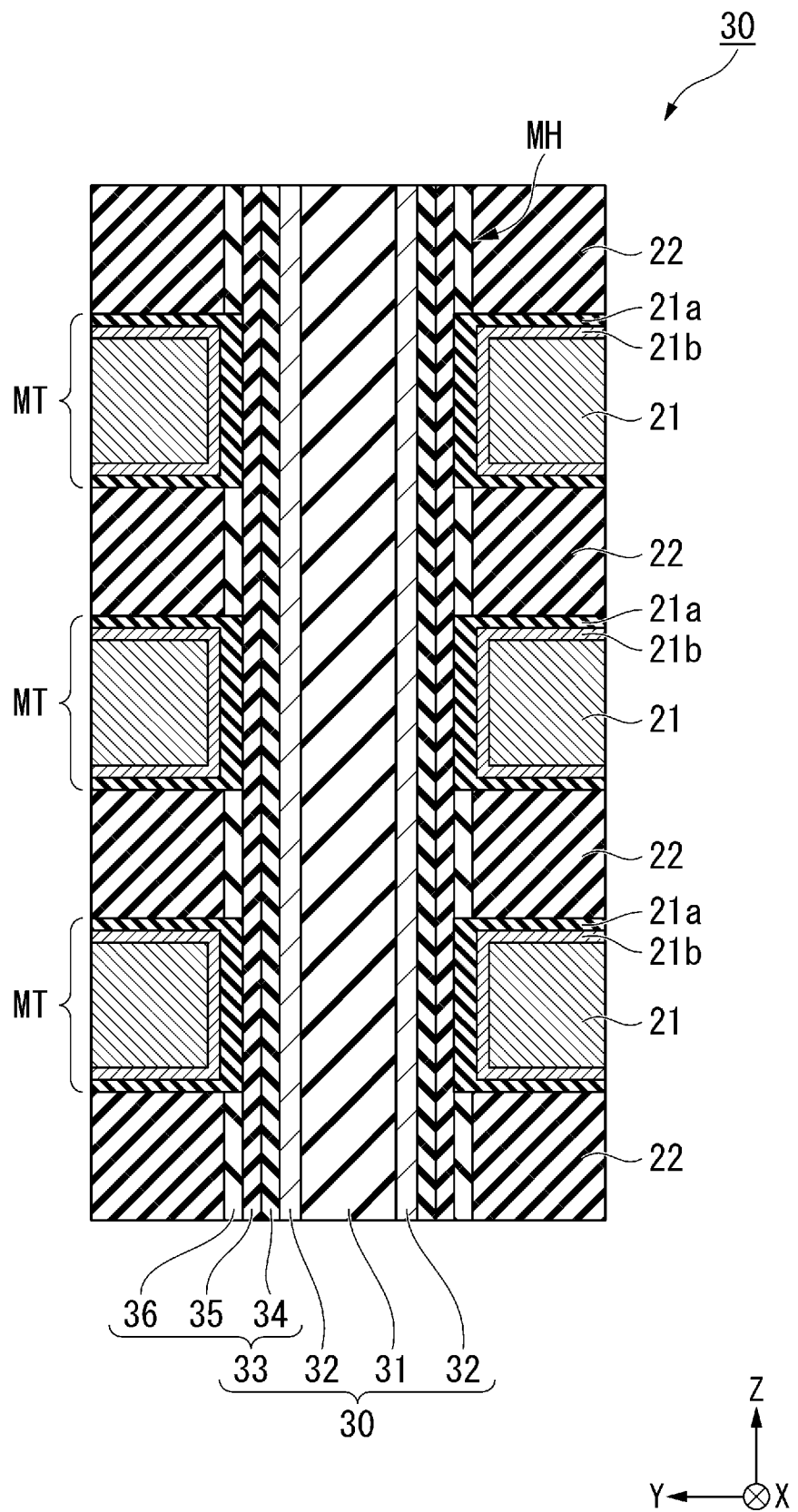
FIG. 5 is an enlarged cross-sectional view of a columnar body of a semiconductor storage device according to a first embodiment.
Figure 6:
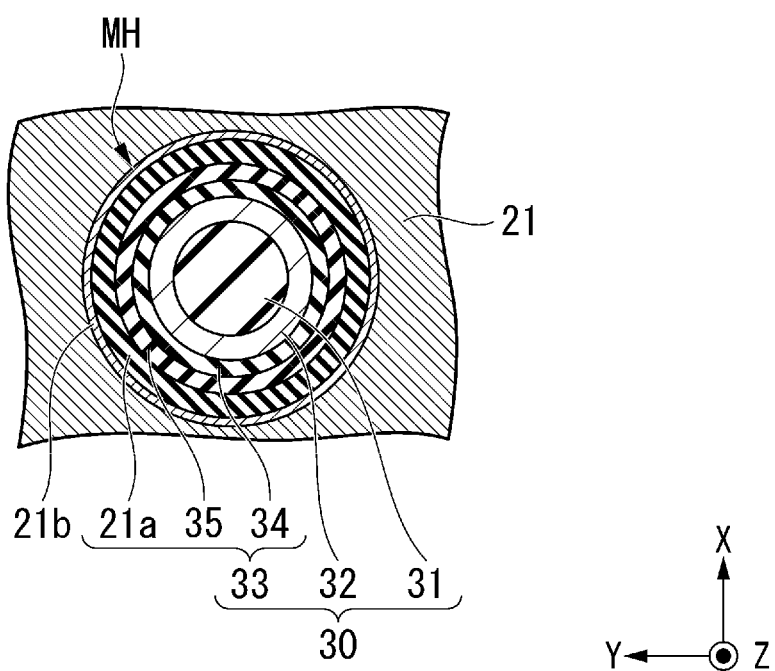
FIG. 6 is an enlarged cross-sectional view of a columnar body of a semiconductor storage device according to a first embodiment, taken along a conductive layer.

FIG. 5 is an enlarged cross-sectional view of the vicinity of a columnar body 30 according to the first embodiment. FIG. 6 is a cross-sectional view of the vicinity of a columnar body 30 according to the first embodiment, cut along the conductive layer 21. FIG. 5 is a cross section of the columnar body 30 taken along a YZ plane, and FIG. 6 is a cross section of the columnar body 30 taken along XY plane. The columnar body 30 is in a memory hole MH formed in the stacked body 20.

Each of the columnar bodies 30 includes a core 31, a semiconductor body 32, and a memory film 33. In the memory hole MH, the core 31, the semiconductor body 32, and the memory film 33 are provided sequentially from an inner side of the hole MH.

The core 31 extends in the Z direction and has a columnar shape. The core 31 includes, for example, silicon oxide. The core 31 is at the innermost side of the semiconductor body 32.

The semiconductor body 32 extends in the Z direction. The semiconductor body 32 has a cylindrical shape with a bottom surface. The semiconductor body 32 covers an outer side surface of the core 31. The semiconductor body 32 includes, for example, silicon. The silicon is, for example, polysilicon obtained by crystallizing amorphous silicon. The semiconductor body 32 is a channel for each of the first select transistor S1, the memory cell transistor MT, and the second select transistor S2. The channel is a flow path of carriers between a source side and a drain side.

The memory film 33 extends in the Z direction. The memory film 33 covers an outer side surface of the semiconductor body 32. The memory film 33 is between an inner surface of the memory hole MH and the outer side surface of the semiconductor body 32. The memory film 33 includes, for example, a tunnel insulating film 34, a charge storage film 35, and a cover insulating film 36. The tunnel insulating film 34, the charge storage film 35, and the cover insulating film 36 are sequentially provided around the semiconductor body 32.

The tunnel insulating film 34 is located between the charge storage film 35 and the semiconductor body 32. The tunnel insulating film 34 includes, for example, silicon oxide or silicon oxide and silicon nitride. The tunnel insulating film 34 is a potential barrier between the semiconductor body 32 and the charge storage film 35.

The charge storage film 35 is located between the conductive layer 21 and the tunnel insulating film 34 and between the insulating layer 22 and the tunnel insulating film 34. The charge storage film 35 includes, for example, silicon nitride. A part in which the charge storage film 35 intersects each of the conductive layers 21 functions as a transistor. The memory cell transistor MT stores data based on presence or absence of charges or a stored charge amount in the part (a charge storage unit) in which the charge storage film 35 intersects each of the conductive layers 21. The charge storage unit is located between the conductive layer 21 and the semiconductor body 32 and is surrounded by an insulating material.

The cover insulating film 36 is located, for example, between each of the insulating layers 22 and the charge storage film 35. The cover insulating film 36 includes, for example, silicon oxide. The cover insulating film 36 protects the charge storage film 35 from etching during processing. The cover insulating film 36 may be eliminated, or may be partially left between the conductive layer 21 and the charge storage film 35 and used as a block insulating film.

As shown in FIG. 5, a block insulating film 21a and a barrier film 21b may be provided between the conductive layer 21 and the insulating layer 22 and between the conductive layer 21 and the memory film 33. The block insulating film 21a prevents back-tunneling. The back-tunneling is a phenomenon in which charges return from the conductive layer 21 to the memory film 33. The barrier film 21b improves adhesiveness between the conductive layer 21 and the block insulating film 21a. The block insulating film 21a is, for example, a stacked structure film in which a silicon oxide film, a metal oxide film, and a plurality of insulating films are stacked. An example of metal oxide is aluminum oxide. When the conductive layer 21 is made of, for example, tungsten, the barrier film 21b is made of, for example, titanium nitride or is a stacked structure film of titanium nitride and titanium.

The contact CP and the via V1 are contact plugs that electrically connect the columnar body 30 and the bit line BL. The contact CP and the via V1 are in an interlayer insulating layer. The contact CP and the via V1 penetrate the interlayer insulating layer in the Z direction. The contact CP and the via V1 include a conductive material. The contact CP and the via V1 are made of, for example, tungsten.

The via V1 electrically connects the contact CP and the bit line BL. In a plan view from the Z direction, the via V1 is smaller than the contact CP, and most of the via V1 is inside the outer perimeter of the contact CP. A geometric center of the via V1 is shifted (offset) from a geometric center of the contact CP, for example. The pitches P1, P2, P3, P4, P5, P6, and P7 in the Y direction between the vias V1 corresponding to the first columnar body 30A to the eighth columnar body 30H respectively shown in FIGS. 3A and 3B are taken as distances between geometric centers of adjacent vias V1.

<1-4> Effects

As in the semiconductor storage device 1 according to the embodiments described above, by optimizing arrangement positions of vias V1 in adjacent strings STR (e.g., string STRa and string STRb in FIG. 3A) in the Y direction with slits SHE interposed therebetween, it is possible to prevent contact or short circuit between the vias V1 when the vias V1 are manufactured by photolithography, and to improve the integration of columnar bodies 30 in one block BLK. As a result, integration of the memory cell transistors MT can be improved.

In addition, in the semiconductor storage device 1 according to the first embodiment, any of the columnar bodies 30 can function as a storage region instead of being a dummy. That is, the columnar bodies 30 functioning as storage regions are densely arranged, and the semiconductor storage device 1 according to the first embodiment is excellent in integration.

Embodiments are not limited to the above-described examples. For example, the memory stacked film may be a ferroelectric film in a Ferroelectric FET (FeFET) memory that stores data according to a direction of polarization. The ferroelectric film is formed of, for example, hafnium oxide.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor storage device, comprising:
a stacked body in which a plurality of conductive layers and a plurality of insulating layers are alternately stacked in a first direction;
a plurality of conductive lines extending along a second direction intersecting the first direction and spaced from each other in a third direction intersecting the first and second directions;
a plurality of insulators extending along the first and third directions in the stacked body, spaced from each other in the second direction, and dividing one or more of the conductive layers along the second direction;
a plurality of columnar bodies extending along the first direction and spaced along the second direction between two of the insulators, each of the columnar bodies including a semiconductor body forming a plurality of memory cells; and
a plurality of vias each electrically connected between one of the conductive lines and a corresponding one of the columnar bodies, wherein
the conductive lines include first, second, third, and fourth lines arranged in this order,
the columnar bodies include first, second, third, and fourth columnar bodies arranged in this order, and
when viewed from the first direction, the first, second, third, and fourth columnar bodies respectively overlap and are electrically connected to the first, third, second, and fourth lines via the corresponding vias.

2. The semiconductor storage device according to claim 1, wherein the insulators include a first insulator dividing all the conductive layers in the second direction.

3. The semiconductor storage device according to claim 2, wherein
the insulators further include a plurality of second insulators dividing at least an uppermost conductive layer in the second direction, and
the columnar bodies are between the first insulator and one of the second insulators or between two of the second insulators that are adjacent to each other in the second direction.

4. The semiconductor storage device according to claim 3, wherein
the columnar bodies further include fifth, sixth, seventh, and eighth columnar bodies arranged in this order, and
when viewed from the first direction, the fifth, sixth, seventh, and eighth columnar bodies respectively overlap and are electrically connected to the second, fourth, first, and third lines via the corresponding vias.

5. The semiconductor storage device according to claim 4, wherein the first through fourth columnar bodies are between a first pair of the second insulators that are adjacent to each other in the second direction, and the fifth through eighth columnar bodies are between a second pair of the second insulators that are adjacent to each other and share a same second insulator with the first pair.

6. The semiconductor storage device according to claim 4, wherein a first interval in the second direction between the vias connected to the second and third columnar bodies is larger than a second interval in the second direction between the vias connected to the first and second columnar bodies and a third interval in the second direction between the vias connected to the third and fourth columnar bodies.

7. The semiconductor storage device according to claim 6, wherein each of the first interval and a fourth interval in the second direction between the vias connected to the sixth and seventh columnar bodies is larger than any one of:
the second interval,
the third interval,
a fifth interval in the second direction between the vias connected to the fourth and fifth columnar bodies,
a sixth interval in the second direction between the vias connected to the fifth and sixth columnar bodies, and
a seventh interval in the second direction between the vias connected to the seventh and eighth columnar bodies.

8. The semiconductor storage device according to claim 7, wherein the second, third, fifth, sixth, and seventh intervals are identical.

9. The semiconductor storage device according to claim 6, wherein the second and third intervals are identical.

10. The semiconductor storage device according to claim 1, wherein a first interval in the second direction between the vias connected to the second and third columnar bodies is larger than a second interval in the second direction between the vias connected to the first and second columnar bodies and a third interval in the second direction between the vias connected to the third and fourth columnar bodies.

11. The semiconductor storage device according to claim 10, wherein the second and third intervals are equal.

12. The semiconductor storage device according to claim 1, wherein the columnar bodies are disposed at substantially equal pitches in a plan view from the first direction.

13. The semiconductor storage device according to claim 1, wherein the conductive lines are bit lines.

14. A semiconductor storage device, comprising:
a stacked body in which a plurality of conductive layers and a plurality of insulating layers are alternately stacked in a first direction;
a plurality of conductive lines extending along a second direction intersecting the first direction and spaced from each other in a third direction intersecting the first and second directions;
a plurality of columnar bodies extending along the first direction and spaced along the second direction, each of the columnar bodies including a semiconductor body forming a plurality of memory cells; and
a plurality of vias, each electrically connected between one of the conductive lines and a corresponding one of the columnar bodies, wherein
two of the columnar bodies that are adjacent to each other have centers that are shifted from one another in the third direction and are electrically connected to two of the conductive lines that are not adjacent to each other.

15. The semiconductor storage device according to claim 14, further comprising:
a plurality of insulators extending along the first and third directions in the stacked body, spaced from each other in the second direction, and dividing one or more of the conductive layers in the second direction, wherein
the columnar bodies are arranged between two of the insulators.

16. The semiconductor storage device according to claim 15, wherein the insulators include a first insulator dividing all the conductive layers in the second direction.

17. The semiconductor storage device according to claim 16, wherein
the insulators further include a plurality of second insulators dividing at least an uppermost conductive layer in the second direction, and
the columnar bodies are between the first insulator and one of the second insulators or between two of the second insulators that are adjacent to each other in the second direction.

18. The semiconductor storage device according to claim 14, wherein
the vias include first, second, third, and fourth vias arranged along the second direction in this order, and
in the second direction, a first interval between the first and second vias is smaller than a second interval between the second and third vias.

19. The semiconductor storage device according to claim 18, wherein
the first interval is equal to a third interval between the third and fourth vias in the second direction.

20. A storage system, comprising:
a memory controller; and
a semiconductor storage device connectable to the memory controller and configured to perform a memory operation in response to an instruction from the memory controller, wherein the semiconductor storage device includes:
a stacked body in which a plurality of conductive layers and a plurality of insulating layers are alternately stacked in a first direction,
a plurality of conductive lines extending along a second direction intersecting the first direction and spaced from each other in a third direction intersecting the first and second directions,
a plurality of insulators extending along the first and third directions in the stacked body, spaced from each other in the second direction, and dividing one or more of the conductive layers along the second direction,
a plurality of columnar bodies extending along the first direction and spaced along the second direction between two of the insulators, each of the columnar bodies including a semiconductor body forming a plurality of memory cells, and
a plurality of vias each electrically connected between one of the conductive lines and a corresponding one of the columnar bodies, wherein
the conductive lines include first, second, third, and fourth lines arranged in this order,
the columnar bodies include first, second, third, and fourth columnar bodies arranged in this order, and
when viewed from the first direction, the first, second, third, and fourth columnar bodies respectively overlap and are electrically connected to the first, third, second, and fourth lines via the corresponding vias.

* * * * *